United States Patent
Manchanda et al.

(10) Patent No.: US 7,456,064 B2
(45) Date of Patent: Nov. 25, 2008

(54) HIGH K DIELECTRIC MATERIAL AND METHOD OF MAKING A HIGH K DIELECTRIC MATERIAL

(75) Inventors: Lalita Manchanda, Basking Ridge, NJ (US); Martin Laurence Green, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 321 days.

(21) Appl. No.: 10/718,536

(22) Filed: Nov. 24, 2003

(65) Prior Publication Data

US 2004/0099899 A1 May 27, 2004

Related U.S. Application Data

(62) Division of application No. 10/155,173, filed on May 28, 2002, now Pat. No. 6,680,130.

(51) Int. Cl.
H01L 21/00 (2006.01)
(52) U.S. Cl. ............... 438/240; 438/287; 428/689
(58) Field of Classification Search ............. 438/240, 438/287, 689
See application file for complete search history.

(56) References Cited

U.S. PATENT DOCUMENTS

| | | | | |
|---|---|---|---|---|
| 3,620,780 A * | 11/1971 | Economy et al. | ............ | 501/95.1 |
| 4,837,123 A * | 6/1989 | Kato et al. | ............ | 430/269 |
| 6,066,219 A * | 5/2000 | Schulz-Harder et al. | . | 156/89.11 |
| 6,133,119 A * | 10/2000 | Yamazaki | ............ | 438/476 |
| 6,184,072 B1 | 2/2001 | Kaushik et al. | | |
| 6,262,850 B1 * | 7/2001 | Krisko et al. | ............ | 359/634 |
| 6,292,302 B1 * | 9/2001 | Krisko et al. | ............ | 359/634 |
| 6,380,687 B1 * | 4/2002 | Yamazaki | ............ | 315/169.3 |
| 6,426,245 B1 * | 7/2002 | Kawasaki et al. | ............ | 438/166 |
| 6,458,512 B1 * | 10/2002 | Budd et al. | ............ | 430/311 |
| 6,527,830 B1 * | 3/2003 | Neu et al. | ............ | 95/98 |
| 6,576,482 B1 * | 6/2003 | Aggarwal et al. | ............ | 438/3 |
| 6,624,013 B2 * | 9/2003 | Kawasaki et al. | ............ | 438/160 |
| 6,624,049 B1 * | 9/2003 | Yamazaki | ............ | 438/476 |
| 6,671,109 B2 * | 12/2003 | Kunii | ............ | 359/888 |
| 6,680,130 B2 * | 1/2004 | Manchanda et al. | ............ | 428/689 |
| 6,703,277 B1 * | 3/2004 | Paton et al. | ............ | 438/287 |
| 6,844,249 B2 * | 1/2005 | Kawasaki et al. | ............ | 438/487 |
| 6,893,746 B1 * | 5/2005 | Kirino et al. | ............ | 428/827 |
| 6,984,573 B2 * | 1/2006 | Yamazaki et al. | ............ | 438/487 |
| 7,045,438 B2 * | 5/2006 | Yamazaki et al. | ............ | 438/455 |
| 7,083,870 B2 * | 8/2006 | Shimizu et al. | ............ | 428/828 |
| 2001/0041304 A1 * | 11/2001 | Uno et al. | ............ | 430/270.13 |
| 2002/0146874 A1 * | 10/2002 | Kawasaki et al. | ............ | 438/166 |
| 2003/0025118 A1 * | 2/2003 | Yamazaki et al. | ............ | 257/79 |
| 2003/0189210 A1 * | 10/2003 | Yamazaki et al. | ............ | 257/72 |
| 2003/0224218 A1 * | 12/2003 | Manchanda et al. | ............ | 428/701 |
| 2004/0007706 A1 * | 1/2004 | Yamazaki et al. | ............ | 257/79 |
| 2004/0023073 A1 * | 2/2004 | Shimizu et al. | ...... | 428/694 MM |
| 2004/0040938 A1 * | 3/2004 | Yamazaki et al. | ......... | 219/121.6 |

(Continued)

*Primary Examiner*—Laura M Menz
(74) *Attorney, Agent, or Firm*—Mendelsohn & Associates, P.C.; Yuri Gruzdkov; Steve Mendelsohn

(57) ABSTRACT

A dielectric material having a high dielectric constant includes a Group III metal oxide and a Group V element. The incorporation of the Group V element in the Group III metal oxide material reduces the number of structural defects in the dielectric material, and reduces both the fixed charge density and the conduction current of the dielectric material.

9 Claims, 2 Drawing Sheets

U.S. PATENT DOCUMENTS

| | | | |
|---|---|---|---|
| 2004/0057157 A1* | 3/2004 | Shimizu et al. | 360/135 |
| 2004/0072383 A1* | 4/2004 | Nagahama et al. | 438/47 |
| 2004/0092061 A1* | 5/2004 | Kawasaki et al. | 438/166 |
| 2004/0099899 A1* | 5/2004 | Manchanda et al. | 257/310 |
| 2004/0106016 A1* | 6/2004 | Okada et al. | 428/698 |
| 2004/0254419 A1* | 12/2004 | Wang et al. | 600/8 |
| 2005/0017319 A1* | 1/2005 | Manabe et al. | 257/498 |
| 2005/0025797 A1* | 2/2005 | Wang et al. | 424/422 |
| 2005/0079132 A1* | 4/2005 | Wang et al. | 424/1.11 |
| 2005/0080166 A1* | 4/2005 | Keller et al. | 524/2 |
| 2005/0089799 A1* | 4/2005 | Otoba et al. | 430/270.11 |
| 2005/0107870 A1* | 5/2005 | Wang et al. | 623/1.44 |
| 2005/0119725 A1* | 6/2005 | Wang et al. | 623/1.15 |
| 2005/0149002 A1* | 7/2005 | Wang et al. | 606/1 |
| 2005/0149169 A1* | 7/2005 | Wang et al. | 623/1.15 |
| 2005/0155779 A1* | 7/2005 | Wang et al. | 174/35 MS |
| 2005/0165471 A1* | 7/2005 | Wang et al. | 623/1.15 |
| 2005/0216075 A1* | 9/2005 | Wang et al. | 623/1.15 |
| 2005/0230752 A1* | 10/2005 | Kanno et al. | 257/347 |
| 2006/0009016 A1* | 1/2006 | Yamazaki et al. | 438/487 |
| 2006/0027817 A1* | 2/2006 | Yamazaki et al. | 257/79 |
| 2006/0033867 A1* | 2/2006 | Krisko et al. | 349/113 |
| 2006/0079039 A1* | 4/2006 | Ohtani et al. | 438/164 |
| 2006/0102871 A1* | 5/2006 | Wang et al. | 252/62.51 R |
| 2006/0118758 A1* | 6/2006 | Wang et al. | 252/62.51 R |
| 2006/0128118 A1* | 6/2006 | Nagahama et al. | 438/458 |
| 2006/0142853 A1* | 6/2006 | Wang et al. | 623/1.46 |
| 2006/0226517 A1* | 10/2006 | Iwanaga et al. | 257/639 |
| 2006/0257582 A1* | 11/2006 | Keller et al. | 427/427.4 |

* cited by examiner

HIGH K DIELECTRIC MATERIAL AND METHOD OF MAKING A HIGH K DIELECTRIC MATERIAL

This application is a divisional application of U.S. patent application Ser. No. 10/155,173, filed May 28, 2002 now U.S. Pat. No. 6,680,130, the entirety of which is incorporated herein by reference.

BACKGROUND OF THE INVENTION

1. Field of the Invention

The invention relates to semiconductor devices and components and, specifically, to metal oxide dielectric materials for use in semiconductor devices and components.

2. Description of Related Art

Silicon dioxide ($SiO_2$) is widely employed in the semiconductor industry as a gate dielectric for both logic and memory applications. When $SiO_2$, which has a dielectric constant (K) value of approximately 4, is employed in a thin (i.e., less than about 15 Å) layer, the amount of leakage current from the gate dielectric can become prohibitively high.

To reduce leakage current, $SiO_2$ has been substituted with a high K dielectric material, i.e., a material with a K value of greater than 4. Most of these high K gate dielectrics are metal oxides. For example, U.S. Pat. No. 6,184,072 describes using metals like zirconium and hafnium to increase the dielectric value of an $SiO_2$ gate dielectric layer. Most metal oxides, however, have a large number of structural defects. Problems associated with the use of metal oxides having these structural defects include high interface state densities between the oxide and the underlying semiconductor. These charges can provide a conduction path in the dielectric layer, which leads to adverse device performance. That is, these defects may generate a conduction path in the dielectric, and may also generate charges in the dielectric and at the dielectric/Si interface. The presence of these charges (fixed charges) in the dielectric affects the threshold voltage of a transistor having a metal oxide gate dielectric, and more importantly, the carrier mobility at the dielectric/Si interface.

BRIEF SUMMARY OF THE INVENTION

The present invention is directed to solving the above-described problems associated with using a metal oxide to provide a high K dielectric material. More specifically, the invention addresses problems associated with the use of Group III metal oxides as a high K dielectric material.

The present invention provides a high K dielectric material layer with a reduced number of structural defects and with a decreased fixed charge density by incorporating a Group V element in a Group III metal oxide material. Specifically, the incorporation of a Group V element in a Group III metal oxide reduces the number of defects in the dielectric material, and reduces both the fixed charge density and the conduction current of the dielectric material. The dielectric material has particular use wherever a dielectric is used in semiconductor structures, for example, as a gate dielectric for a transistor, or as a capacitor dielectric.

BRIEF DESCRIPTION OF THE DRAWINGS

These and other features and advantages of the present invention will become more fully apparent from the following detailed description of the exemplary embodiments of the invention which are provided in connection with the accompanying drawings.

DETAILED DESCRIPTION OF THE INVENTION

Figure 1:
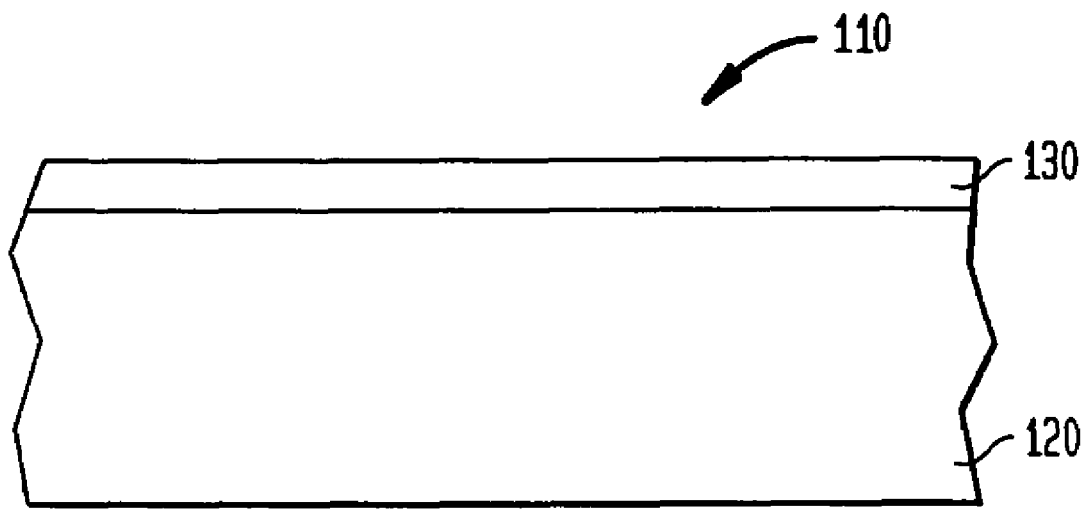
FIG. 1 is a partial cross-sectional view of a dielectric layer constructed in accordance with the present invention for use with a semiconductor device.

FIG. 1 is a partial cross-sectional view of a layered structure 110 having a high K metal oxide dielectric layer 130 according to the present invention on a substrate 120. Substrate 120 is typically silicon. The layered semiconductor structure 110 may be employed as an element of an electronic component such as integrated circuit devices and integrated or discrete components having a layer of dielectric material. For example, high K metal oxide dielectric layer 130 may be employed as a gate dielectric layer in an electronic component comprising a transistor. The electronic component could comprise a capacitor, with the dielectric material forming a dielectric layer between conductive layers of the capacitor.

As described above in the Description of Related Art, conventional high K Group III metal oxides typically have a relatively high charge in the bulk of the film and at the dielectric-semiconductor interface. For the reasons described below, however, the high K metal oxide layer 130 according to the present invention has a reduced charge, i.e., typically a fixed charge density of less than $2 \times 10^{11}/cm^2$. The term "fixed charge density" as used herein means an effective charge measured at the semiconductor dielectric interface, and also accounts for the interface state density.

The metal oxide layer 130 includes a Group III metal oxide, such as, for example, aluminum oxide ($Al_2O_3$). To provide a metal oxide layer 130 having a reduced fixed charge density, the metal oxide layer 130 incorporates a Group V element, such as, for example, nitrogen. More specifically, in one embodiment of the method of incorporating the Group V element in the Group III metal oxide, the metal oxide layer 130 is deposited in an atmosphere containing a mixture of oxygen and nitrogen. The deposition in the presence of an oxygen-nitrogen mixture provides a metal oxide layer 130 having a reduced fixed charge density. The oxygen-to-nitrogen ratio of the oxygen-nitrogen deposition mixture may range, for example, from 24:6, to 18:12, to 9:21 (see Table 1 below), depending upon the characteristics desired in the resultant metal oxide layer 130.

Although the applicants do not wish to be held to a particular theory, the applicants believe that the incorporation of the Group V element facilitates electronic bonding of the Group III oxides and thereby reduces the fixed charge density. More specifically, it is believed, for example, that addition of nitrogen during the growth of the metal oxide may convert the oxide to metal oxynitride.

EXAMPLE

Figure 2:
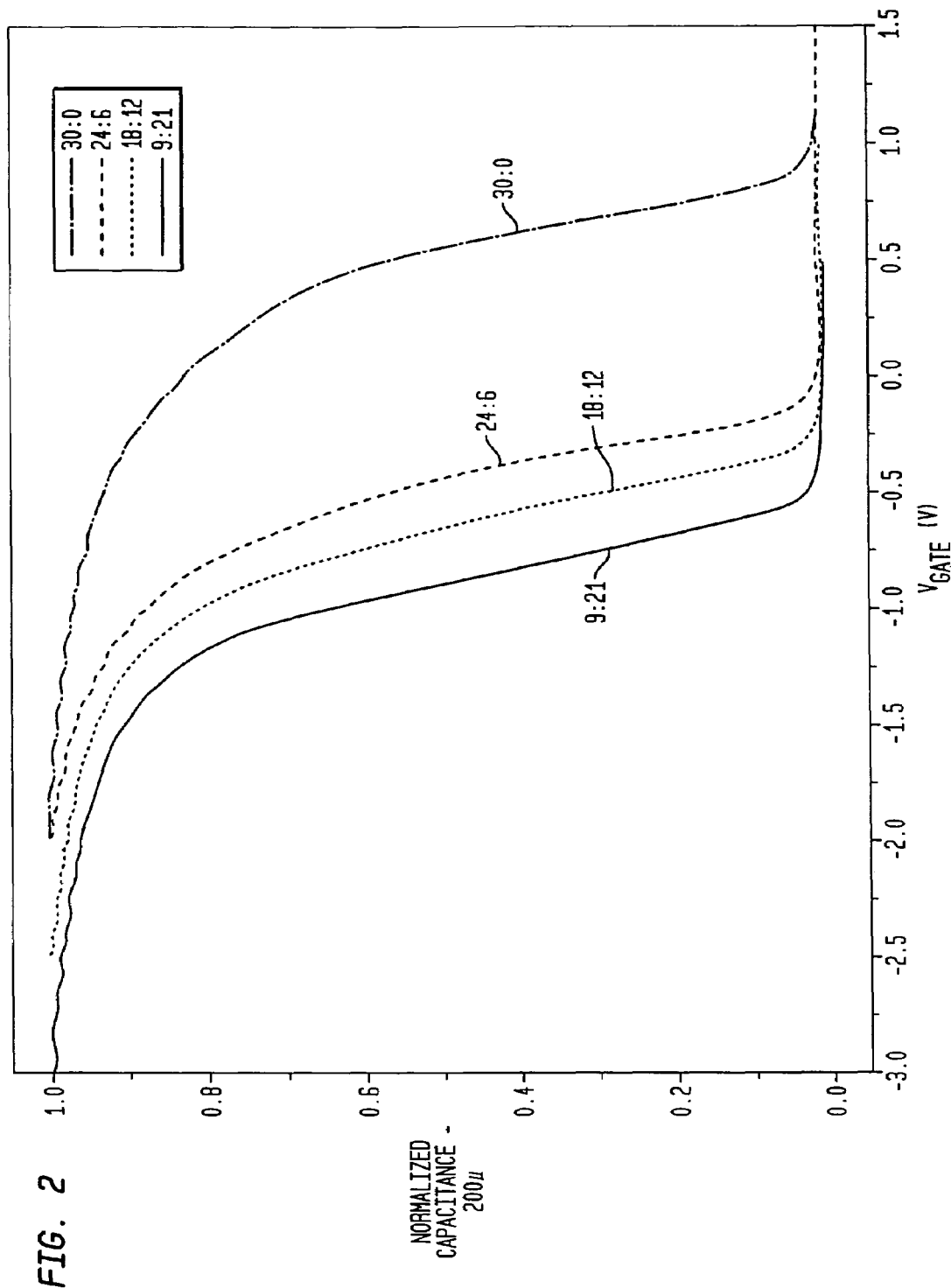
FIG. 2 is a graph of capacitance versus gate voltage for a dielectric layer deposited in an oxygen atmosphere, and for dielectric layers deposited in an atmosphere containing a mixture of oxygen and various amounts of nitrogen.

Using a Varian M2000 metal sputtering tool, various dielectric layers each having an approximate thickness of 10 nm were deposited. FIG. 2 is a graph of capacitance versus gate voltage for a dielectric layer deposited in an oxygen atmosphere, and dielectric layers deposited in an atmosphere containing oxygen and various amounts of nitrogen. An aluminum oxide (i.e., a Group III oxide) layer was reactive-sputter deposited in an oxygen-only atmosphere (i.e., deposited according to a conventional technique). The line labeled "30:0" in FIG. 2 represents the performance of the aluminum oxide layer reactive-sputter deposited in the oxygen-only atmosphere. To provide a metal oxide layer 130 which also includes the Group V element nitrogen, the sputtering was done in a mixture of oxygen and nitrogen. The addition of nitrogen to the oxygen atmosphere reduced the fixed charge density. For example, oxygen-to-nitrogen deposition ratios of 24:6, 18:12, and 9:21 all provide a dielectric layer having a lower fixed charge density than a dielectric layer deposited in an oxygen-only atmosphere. Table 1 summarizes the fixed charge density associated with each of the dielectric layers.

TABLE 1

| O/N Ratio | Fixed Charge Density/cm$^2$ |
|---|---|
| 30:0 | $-4.5 \times 10^{12}$ |
| 24:6 | $-7.5 \times 10^{11}$ |
| 18:12 | $+3.0 \times 10^{10}$ |
| 9:21 | $+9.0 \times 10^{11}$ |

Though the use of reactive sputtering is described in the Example as the method of incorporating nitrogen in the metal oxide, the nitrogen may be incorporated by various other methods, such as, for example, annealing of the metal oxide film in the presence of $N_2O$, $NO$, or $NH_3$; atomic layer deposition (ALD), chemical vapor deposition (CVD), and metalorganic chemical vapor deposition (MOCVD) using $N_2O$, $NO$, or $NH_3$; plasma nitridation; and oxidation of metal nitrides.

Furthermore, although the invention has been exemplified as employing an oxygen-nitrogen deposition mixture to reduce the fixed charge density in an aluminum oxide, the invention is not limited to the nitrogen and aluminum oxide embodiments. Rather, the invention can be employed to reduce the fixed charge density in Group III metal oxides other than aluminum oxide, such as, for example, yttrium oxide ($Y_2O_3$). In addition, the deposition mixture may include a Group V element other than nitrogen, such as, for example, phosphorous. The invention can also be employed to reduce the fixed charge density in multi-component oxides that include a Group III metal, such as, for example, a Zr—Al—O oxide.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A method of fabricating a dielectric material, said method comprising: incorporating a Group V element in a Group III metal oxide, wherein said dielectric material is deposited in an atmosphere comprising a mixture of oxygen and nitrogen having an oxygen-to-nitrogen ratio ranging from about 24:6 to about 18:12.

2. A method according to claim 1, wherein said Group III metal oxide is aluminum oxide.

3. A method according to claim 1, wherein said Group V element is selected from the group consisting of nitrogen and phosphorous.

4. A method according to claim 2, wherein said Group V element is selected from the group consisting of nitrogen and phosphorous.

5. A method according to claim 1, wherein said mixture of oxygen and nitrogen has an oxygen-to-nitrogen ratio of about 18:12.

6. A method according to claim 1, wherein said dielectric material is formed by a technique selected from the group consisting of reactive sputtering, annealing, atomic layer deposition (ALD), chemical vapor deposition (CVD), metalorganic chemical vapor deposition (MOCVD), plasma nitridation, and oxidation of metal nitrides.

7. A method according to claim 1, comprising forming the dielectric material on a substrate using the oxygen and the nitrogen from said atmosphere.

8. A method according to claim 4, wherein:
   said dielectric material is formed by a technique selected from the group consisting of reactive sputtering, annealing, atomic layer deposition (ALD), chemical vapor deposition (CVD), metalorganic chemical vapor deposition (MOCVD), plasma nitridation, and oxidation of metal nitrides; and
   the method comprises the step of forming the dielectric material on a substrate using the oxygen and the nitrogen from said atmosphere.

9. A method according to claim 8, wherein said mixture of oxygen and nitrogen has an oxygen-to-nitrogen ratio of about 18:12.

* * * * *